United States Patent
Ando et al.

(10) Patent No.: US 7,541,262 B2
(45) Date of Patent: Jun. 2, 2009

(54) METHOD FOR PRODUCING SEMICONDUCTOR DEVICE

(75) Inventors: Masanobu Ando, Aichi-ken (JP);
Toshiya Uemura, Aichi-ken (JP);
Shigemi Horiuchi, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 170 days.

(21) Appl. No.: 11/633,622

(22) Filed: Dec. 5, 2006

(65) Prior Publication Data

US 2007/0141807 A1 Jun. 21, 2007

(30) Foreign Application Priority Data

Dec. 6, 2005 (JP) ............................. 2005-352485

(51) Int. Cl.
*H01L 21/30* (2006.01)

(52) U.S. Cl. ................ 438/455; 438/458; 257/E21.088

(58) Field of Classification Search .................. 438/22, 438/46, 47, 39, 40, 118, 455, 458, 460
See application file for complete search history.

(56) References Cited

U.S. PATENT DOCUMENTS

| | | | |
|---|---|---|---|
| 6,071,795 A | 6/2000 | Cheung et al. | |
| 6,214,733 B1 * | 4/2001 | Sickmiller | 438/691 |
| 7,183,645 B2 * | 2/2007 | Kurosawa et al. | 257/737 |
| 2006/0244001 A1 * | 11/2006 | Lee et al. | 257/103 |

FOREIGN PATENT DOCUMENTS

DE 100 17 337 A1 10/2001
DE 10 2004 016 697 A1 9/2005

OTHER PUBLICATIONS

German Office Action dated Nov. 26, 2007.
Testsuo Fujii, et al., "Micro Cavity Effect in GaN-Based Light-Emitting Diodes Formed by Laser Lift-Off and Etch-Back Technique", Japanese Journal of Applied Physics, vol. 43, No. 3B, 2004, pp. L411-L413.

* cited by examiner

*Primary Examiner*—Phat X Cao
*Assistant Examiner*—Nga Doan
(74) *Attorney, Agent, or Firm*—McGinn IP Law Group, PLLC

(57) ABSTRACT

The present invention contemplates preventing clogging of a dicer for forming separation trenches in a semiconductor wafer, and as well improving the yield of a semiconductor device cut out of the semiconductor wafer. A second adhesive to be charged into spaces contains an epoxy material as a base material. Silica filler particles (diameter: about 2 to about 4 μm) are added to the base material in an appropriate amount. Charging of the second adhesive may be performed by adding the adhesive dropwise to a side wall of a semiconductor wafer, or by immersing an edge of the semiconductor wafer in the adhesive in the form of liquid. When a liquid-form epoxy material of low viscosity is employed, the spaces can be evenly filled with the second adhesive by capillary action. An n-electrode is formed on an exposed surface of an n-type layer through vapor deposition employing a resist mask. Separation trenches are formed through half-cut dicing from the exposed surface of the n-type layer toward the second adhesive.

7 Claims, 5 Drawing Sheets

METHOD FOR PRODUCING SEMICONDUCTOR DEVICE

BACKGROUND OF THE INVENTION

1. Field of the Invention

The present invention relates to a method for producing a semiconductor device through the laser lift-off process.

The method of the present invention is very useful for improvement of quality and productivity of semiconductor devices.

2. Background Art

Conventionally known techniques for producing a semiconductor wafer through the laser lift-off process include a technique disclosed in the specification of U.S. Pat. No. 6,071,795. In the disclosed technique, a GaN crystal layer grown on a surface of a sapphire substrate is bonded to a silicon (Si) supporting substrate by use of an electrically conductive adhesive, and subsequently the GaN crystal layer is irradiated with laser beam from the back surface (i.e., the surface opposite the crystal growth surface) of the sapphire substrate, to thereby melt crystalline GaN grown in the vicinity of the crystal growth surface of the sapphire substrate, for removal of the sapphire substrate from the GaN crystal layer of interest.

Through such a production process (laser lift-off process), the non-electrically conductive sapphire substrate can be removed from the GaN crystal layer of interest without causing any damage to the GaN crystal layer. Therefore, when appropriate electrical conductivity is imparted to the supporting substrate, electrodes can be formed on both surfaces of a semiconductor wafer formed of the semiconductor crystal layer, which has been grown on the sapphire substrate.

In the case of production of an LED or a similar device, in which light is extracted through the back surface of the semiconductor crystal layer on which the sapphire substrate has been provided, removal of the sapphire substrate through such a production process is advantageous in that, for example, light extraction efficiency is improved.

The aforementioned electrically conductive adhesive employed for bonding between the GaN crystal layer and the supporting substrate is generally formed of a solder material containing a metal (e.g., AuSn). Therefore, when separation trenches are formed, by means of a dicer, in the semiconductor wafer before the wafer is cut into individual chips, the metal causes clogging of the dicer. Meanwhile, a layer formed of the metal is difficult to break as compared with a layer formed of a material other than the metal (e.g., a semiconductor crystal), and thus difficulty may be encountered in reliably cutting the semiconductor wafer into individual chips.

In view of the foregoing, the present inventors have conceived a method in which a metal layer formed of, for example, an electrically conductive adhesive is not provided on at least a region through which a dicer blade is to be positioned.

FIG. 4A shows the configuration of a semiconductor wafer in which a metal layer formed of an electrically conductive adhesive, an electrode, or the like and employed for bonding between the aforementioned GaN crystal layer and the supporting substrate is provided in a selective manner; i.e., in a dicer-blade-positioning region and in the vicinity thereof, no metal layer is formed. The semiconductor wafer A1 includes a sapphire substrate 1, and a semiconductor crystal layer 2 grown on the crystal growth surface of the sapphire substrate 1. Islands-patterned electrodes 4 formed on a surface 2b of the semiconductor crystal layer 2 are bonded to islands-patterned electrodes 5 formed on a surface 3a of a supporting substrate 3 by use of an electrically conductive adhesive constituting the uppermost layer of at least one of the electrodes 4 and 5.

Thus, portions where the metal layer is provided (spaces R) are provided in the semiconductor wafer so that semiconductor chips are periodically formed. With this configuration, when separation trenches for separating the semiconductor wafer into individual chips along separation planes σ are formed on a to-be-exposed surface 2a of the semiconductor crystal layer 2, even if the tip of a dicer blade reaches the vicinity of a bonding portion between the electrodes 4 and 5, the dicer does not come into contact with the metal layer. Therefore, clogging of the dicer caused by the metal can be obviated. In addition, since the laterally provided metal layer is not shared with individual chips to be formed, the semiconductor wafer can be more reliably separated into chips.

However, the present inventors have found that this method raises the following problems. When the sapphire substrate 1 is removed through the laser lift-off process, as shown in FIG. 4B (i.e., semiconductor wafer cross-sectional view), cracks γ are prone to be formed in the semiconductor crystal layer 2 along the aforementioned spaces R. Such breakages (cracks γ) cause difficulty in neatly providing separation trenches for a to-be-formed device at predetermined positions. These cracks also tend to cause problems in the subsequent step (e.g., incomplete separation), resulting in reduction of the yield of a target semiconductor device.

Easy occurrence of such cracks γ during the course of lift-off of the sapphire substrate 1 through laser beam radiation is considered to be due to the following two causes.

(Cause 1) When a portion of the semiconductor crystal layer 2 is melted in the vicinity of the interface between the layer 2 and the sapphire substrate 1, a heat radiation path is partially blocked by the spaces R. Therefore, the temperature of the molten portion increases locally, and stress due to thermal expansion is difficult to reduce by heat radiation.

(Cause 2) Stress due to thermal expansion is concentrated at a structurally weak portion which has been formed through provision of the spaces R, and thus breakages (cracks γ) tend to occur at the structurally weak portion.

SUMMARY OF THE INVENTION

The present invention has been accomplished in order to solve the aforementioned problems. An object of the present invention is to effectively prevent clogging of a dicer for forming device separation trenches in a semiconductor wafer. Another object of the present invention is to increase the yield of a semiconductor device cut out of the semiconductor wafer.

The aforementioned problems are effectively solved through the below-described means.

A first means of the present invention is a method for producing a semiconductor device through the laser lift-off process, which includes growing a group III nitride based compound semiconductor crystal (as used herein, the term "semiconductor crystal" may also mean, when applicable, "a semiconductor crystal layer") on a substrate, and removing the substrate from the semiconductor crystal through laser beam radiation, the method comprising an electrode formation step of forming metal layer electrodes in an islands-pattern on a surface of a semiconductor crystal grown on a crystal growth substrate, the surface being opposite the surface facing the crystal growth substrate, so that each electrode is provided in an area corresponding to a semiconductor device chip; a supporting substrate bonding step of bonding the electrodes to an electrically conductive substrate for supporting the semiconductor crystal by use of a first adhesive;

an adhesive charging step of charging a second adhesive formed of a resin into spaces provided through the supporting substrate bonding step at chip separation planes between the semiconductor crystal and the supporting substrate; a laser lift-off step of removing the crystal growth substrate from the semiconductor crystal through laser beam radiation; a separation trench formation step of forming separation trenches along the spaces on the surface of the semiconductor crystal which has been exposed through the laser lift-off step; and a separation step of separating the resultant semiconductor wafer into individual chips along the separation trenches.

In the adhesive charging step, the second adhesive is charged into the spaces by capillary action. Therefore, the viscosity of the second adhesive, the size of the spaces, and other conditions are regulated so that capillary action occurs reliably. No particular limitation is imposed on the material of the second adhesive, so long as the adhesive exhibits such a low viscosity that capillary action can occur, and exhibits such a high adhesive force that it attains the below-described effects after being cured. For example, the second adhesive to be employed may be an epoxy, polyamide, polyimide, resist, resin, silicone, or cyanoacrylate adhesive.

The supporting substrate may be formed of a semiconductor material or an electrically conductive material other than a semiconductor material.

The aforementioned semiconductor crystal layer has a multi-layer structure including two or more layers. The semiconductor crystal forming the layer encompasses a two-component semiconductor, a three-component semiconductor, a four-component semiconductor which is represented by the formula: $Al_{1-x-y}Ga_yIn_xN$ ($0 \leq x \leq 1$, $0 \leq y \leq 1$, $0 \leq 1-x-y \leq 1$) and has arbitrary compound crystal proportions, and a semiconductor containing a p-type or n-type impurity.

At least a portion of the aforementioned group III element (Al, Ga, or In) may be substituted with, for example, boron (B) or thallium (Tl); or nitrogen (N) may be at least partially substituted with, for example, phosphorus (P), arsenic (As), antimony (Sb), or bismuth (Bi).

The aforementioned p-type impurity (acceptor) to be added may be, for example, a known p-type impurity such as magnesium (Mg) or calcium (Ca).

The aforementioned n-type impurity (donor) to be added may be, for example, a known n-type impurity such as silicon (Si), sulfur (S), selenium (Se), tellurium (Te), or germanium (Ge).

Two or more impurity (acceptor or donor) elements may be added simultaneously, or both p-type and n-type impurities may be added simultaneously.

A second means of the present invention is an embodiment of the first means, wherein islands-patterned flat-topped mounds formed of an electrically conductive material are provided at a portion of the supporting substrate that is bonded to the electrodes formed in an islands-pattern so that the mounds are provided with respect to the corresponding electrodes.

Particularly when the flat-topped mounds are formed of a metal, the mounds may be considered similar to, for example, the electrodes 5 shown in FIG. 4A. However, the mounds, which must have electrical conductivity, are not necessarily formed of a metal.

A third means of the present invention is an embodiment of the aforementioned first or second means, wherein the second adhesive contains a base material, and filler particles having a thermal conductivity higher than that of the base material.

When the base material is, for example, an epoxy material, silica particles, alumina particles, or similar particles may be selected as the filler particles having a thermal conductivity higher than that of the base material.

The diameter of the filler particles is preferably 20 μm or less, more preferably 10 μm or less. The diameter of the filler particles to be employed is preferably 0.2 times or less the size of the spaces to be provided. The diameter and amount of the filler particles to be contained in the spaces must be determined so that clogging of the spaces does not occur.

A fourth means of the present invention is an embodiment of any one of the aforementioned first to third means, wherein, in the adhesive charging step, a portion of the supporting substrate is immersed in the second adhesive in the form of liquid in a direction perpendicular or non-parallel to the liquid surface.

After a portion of the supporting substrate is immersed in the liquid-form second adhesive, finally, the entirety of the substrate may be immersed in the adhesive by gradually increasing the volume of the substrate immersed in the adhesive.

The aforementioned problems can be effectively or reasonably solved through the above-described means of the present invention.

Effects of the above-described means of the present invention are as follows.

According to the first means of the present invention, the aforementioned (cause 1) and (cause 2) can be eliminated simultaneously. Specifically, the spaces which have been temporarily provided are buried with the second adhesive, and thus the second adhesive serves as a heat radiation path and exhibits the effect of releasing excessive heat. In addition, a structurally weak portion which is temporarily formed through provision of the aforementioned spaces is reinforced by means of the adhesive force of the second adhesive; i.e., a structurally weak point is eliminated.

Therefore, stress generated in the semiconductor wafer is effectively reduced through heat radiation, and concentration of the stress to a specific site is avoided.

Thus, according to the first means of the present invention, occurrence of breakages (cracks γ) as shown in, for example, FIG. 4B is prevented. Through this prevention, the subsequent separation trench formation step or the separation step can be carried out smoothly, and the yield of a target semiconductor device can be improved. In addition, clogging of a dicer tends not to occur during the course of cutting of the thus-cured non-metallic second adhesive; i.e., clogging of the dicer can be effectively prevented.

According to the second means of the present invention, the height of the aforementioned spaces is-increased through provision of the aforementioned flat-topped-mounds, and thus the diameter of the spaces is readily increased to a necessary level. Therefore, the entirety of each of the spaces is easily, evenly filled with the aforementioned second adhesive by capillary action. Thus, the second means of the present invention can attain the aforementioned operation and effects of the first means in a more reliable manner.

According to the third means of the present invention, the thermal conductivity of the second adhesive is effectively increased through addition of filler particles having a thermal conductivity higher than that of a base material, and therefore heat radiation effect can be obtained more effectively. Thus, the third means can also attain the aforementioned operation and effects of the first means in a more reliable manner.

According to the fourth means of the present invention, in the aforementioned adhesive charging step, gas remaining in the aforementioned spaces is effectively discharged through outside-facing openings of the spaces, the openings being located on a side wall of the semiconductor wafer and not being immersed in the liquid-form second adhesive. Therefore, the entirety of each of the spaces is easily, evenly filled with the aforementioned second adhesive by capillary action. Thus, the fourth means of the present invention can also attain the aforementioned operation and effects of the first means in a more reliable manner.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described.

However, the present invention is not limited to the below-described embodiment.

First Embodiment

Figure 3:
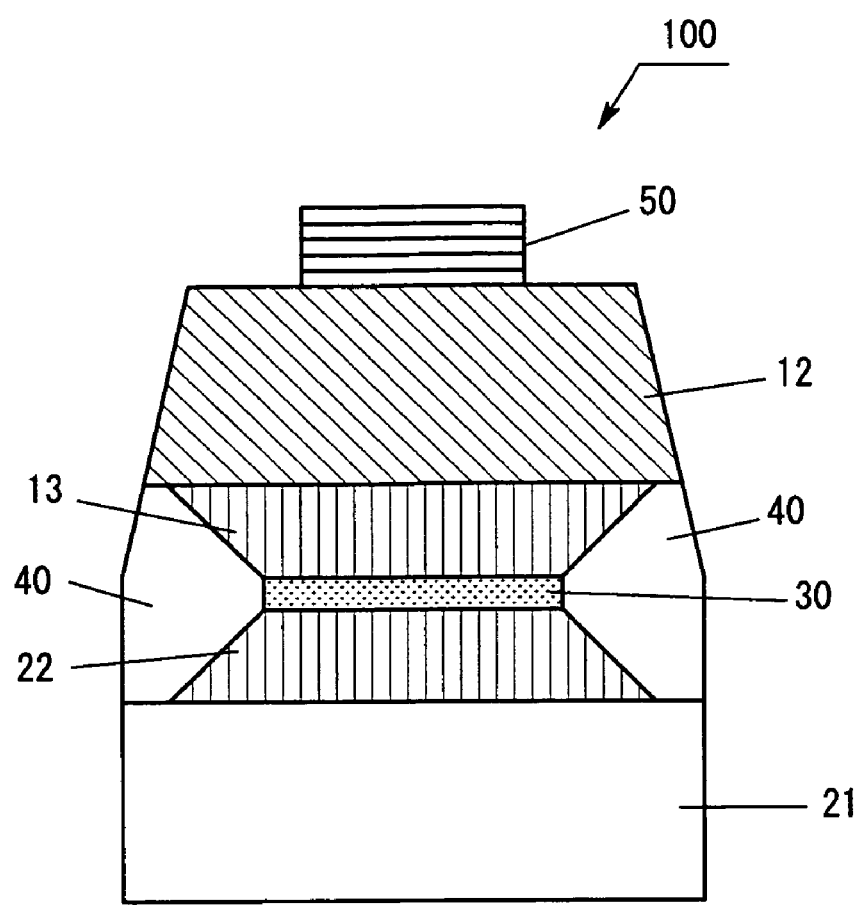
FIG. 3 is a cross-sectional view showing a semiconductor device 100 produced through the steps shown in FIGS. 1A to 1F.

Next will be described, with reference to FIGS. 1A to 1F, production steps for producing a semiconductor device chip (light-emitting diode 100), whose cross-sectional view is shown in FIG. 3.

Figure 1A:
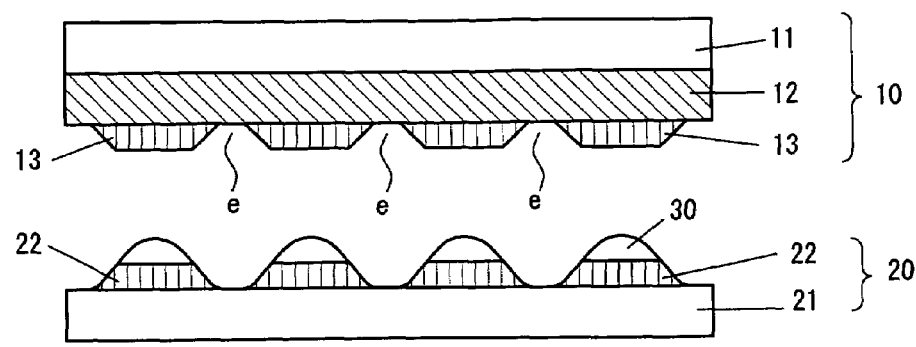
FIG. 1A is a cross-sectional view showing a semiconductor wafer in the state where a main body 10 is not bonded to a supporting substrate 20.

FIG. 1A is a cross-sectional view showing a semiconductor wafer (i.e., a component of the light-emitting diode 100) in the state where a main body 10 is not bonded to a supporting substrate 20. The main body 10 is a plate-like section including, as a main part, a semiconductor crystal layer 12 having a multi-layer structure. The main body 10 is produced by growing the semiconductor crystal layer 12 on the crystal growth surface of a sapphire substrate 11, followed by formation of p-electrodes 13 on the surface of the semiconductor crystal layer 12. The p-electrodes 13 are formed through vapor deposition of a metal. Metal layers constituting the electrodes are not provided on chip-surrounding portions e, which correspond to locations at which the semiconductor wafer is separated into individual chips.

Figure 2A:
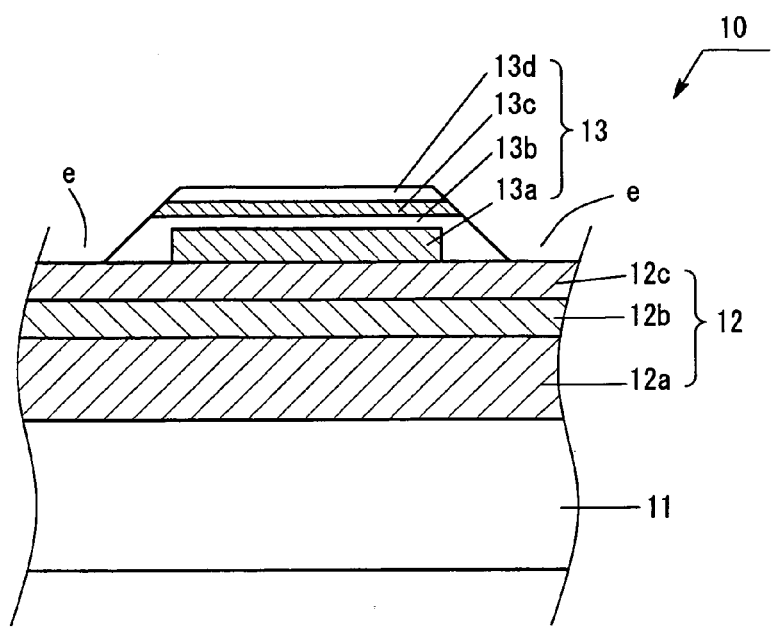
FIG. 2A is a cross-sectional view showing the main body 10 of the semiconductor wafer.

The main body 10 may have any layered structure. FIG. 2A shows a specific example of the structure of the main body 10. An n-type layer 12a may be formed of, for example, a buffer layer, a silicon-doped GaN high-concentration $n^+$-layer, a GaN low-concentration n-layer, or an n-AlGaN cladding layer. A light-emitting layer 12b may have any layered structure. For example, the light-emitting layer 12b may be formed of a light-emitting layer having an MQW structure, or a single light-emitting layer. A p-type layer 12c may be formed of, for example, a magnesium-doped p-AlGaN cladding layer, a GaN low-concentration p-layer, or a GaN high-concentration $p^+$-layer. Hereinafter, these semiconductor crystal layers 12a, 12b, and 12c may be collectively referred to simply as "semiconductor crystal layer 12."

A highly reflective metal layer 13a of rhodium (Rh) (thickness: about 300 nm) is formed on the entire surface of the p-type layer 12c through electron beam deposition of rhodium. The highly reflective metal layer 13a has an islands-pattern formed through photolithography so that each electrode is provided in an area corresponding to a semiconductor chip. After formation of the highly reflective metal layer 13a, the resistance of the p-type layer 12c is reduced through thermal treatment in an $N_2$ atmosphere.

Thereafter, a p-electrode second layer 13b of titanium (Ti) (thickness: about 100 nm), a p-electrode third layer 13c of nickel (Ni) (thickness: about 500 nm), and a p-electrode fourth layer 13d of gold (Au) (thickness: about 50 nm) are successively provided on the highly reflective metal layer 13a through vapor deposition. The chip-surrounding portions e—on which the metal layers 13a to 13d constituting the p-electrodes 13 are not periodically provided in a lateral direction—may be formed through masking, or etching following vapor deposition.

Figure 1B:
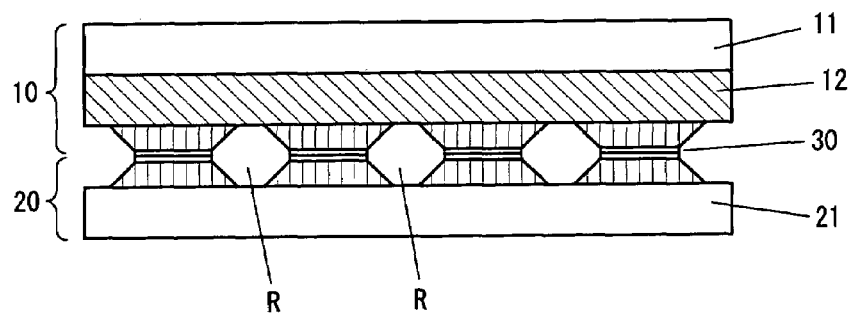
FIG. 1B is a cross-sectional view showing the semiconductor wafer in the state where the main body 10 is bonded to the supporting substrate 20.
Figure 2B:
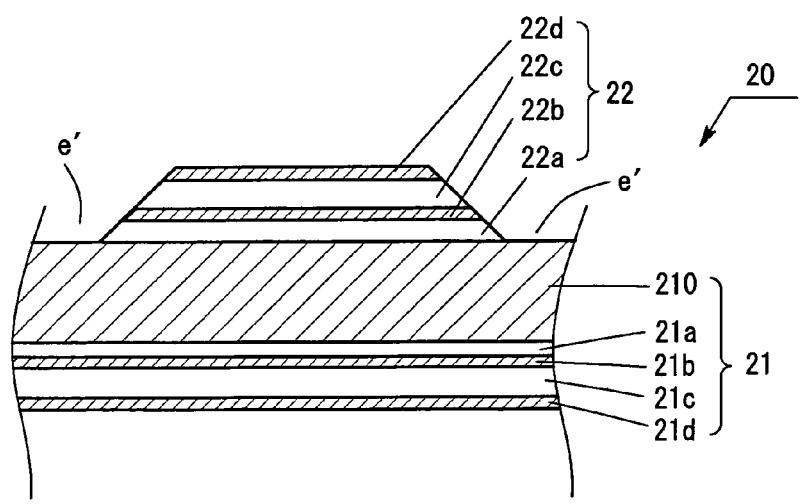
FIG. 2B is a cross-sectional view showing the supporting substrate 20 of the semiconductor wafer.

FIG. 2B is a cross-sectional view showing a specific example of the structure of the supporting substrate 20 of FIG. 1A. Similar to the case of the main body 10, the supporting substrate 20 includes chip-surrounding portions e' having no metal layers. Such portions (chip-surrounding portions e') are not necessarily formed. That is such a patterning is not always required on the side of the supporting substrate 20. When such chip-surrounding portions e' are formed on the supporting substrate 20, as shown in FIG. 1B, the size of spaces R can be increased in a height direction.

The supporting substrate 20 includes an n-type silicon (Si) substrate 210 (thickness: about 400 μm), four metal layers provided on the top surface of the silicon substrate 210, and four metal layers provided on the bottom surface of the silicon substrate 210. An aluminum (Al) layer 21a (thickness: 300 nm), a titanium (Ti) layer 21b (thickness: 50 nm), a nickel (Ni) layer 21c (thickness: 500 nm), and a gold (Au) layer 21d (thickness: 50 nm) are successively provided on the bottom surface of the silicon substrate 210. Similarly, an aluminum (Al) layer 22a (thickness: 300 nm), a titanium (Ti) layer 22b (thickness: 50 nm), a nickel (Ni) layer 22c (thickness: 500 nm), and a gold (Au) layer 22d (thickness: 50 nm) are successively provided on the top surface of the silicon substrate 210.

The layered structure formed of metallic layers constituting the p-electrodes 13, islands-patterned flat-topped mounds 22 corresponding thereto, or external electrodes 21 is determined in consideration of various properties, including optical reflectance, adhesion to adjacent layers, electrical conductivity, and tin diffusion preventing effect. For example, the p-electrode second layer 13b (thickness: about 100 nm)

formed of titanium (Ti) is provided so as to cover the highly reflective metal layer 13a. This layered structure is provided for reinforcing the adhesive strength of the highly reflective metal layer 13a to the p-type layer 12c by titanium, which exhibits high adhesion.

As described above, the main body 10 and the supporting substrate 20 shown in FIG. 1A are provided. A first adhesive 30 (thickness: about 20 µm) shown in FIG. 1A is provided through application of a 80% gold-20% tin solder (Au-20Sn). Subsequently, the main body 10 is aligned with the supporting substrate 20 so that the p-electrodes 13 are precisely provided with respect to the corresponding flat-topped mounds 22, followed by heating at about 300° C. and self-alignment and mechanical alignment processing, to thereby bond the main body 10 to the supporting substrate 20 as shown in FIG. 1B (supporting substrate bonding step). The aforementioned chip-surrounding portions e and e' provide spaces R having a size (diameter) of about 20 µm. Alternatively the first adhesive 30 may be made of metal having a lower melting point.

Figure 1C:
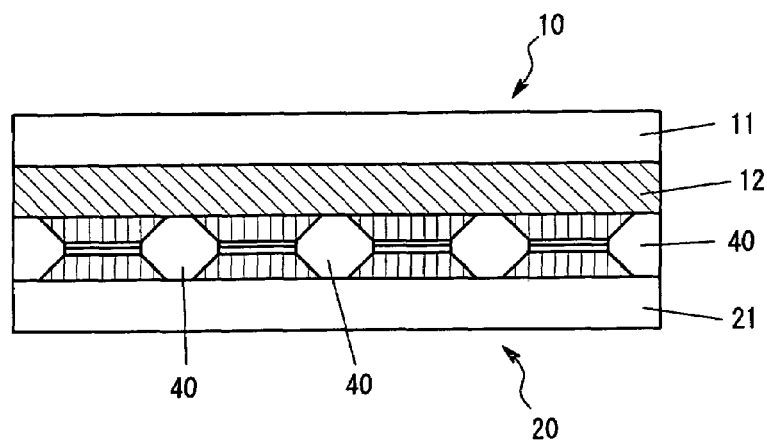
FIG. 1C is a cross-sectional view showing the semiconductor wafer after an adhesive charging step.

Subsequently, a second adhesive is charged into the spaces R. Alternatively the second adhesive may be previously charged into the respective spaces R of the main body 10 and the supporting substrate 20 before the main body 10 is bonded to the supporting substrate 20. The second adhesive contains an epoxy material as a base material. Silica filler particles (diameter: about 2 to about 4 µm) are added to the base material in such an appropriate amount that clogging of the spaces does not occur. Charging of the second adhesive may be performed by adding the adhesive dropwise to a side wall of the semiconductor wafer, or by immersing an edge of the semiconductor wafer in the second adhesive in the form of liquid. When a liquid-form epoxy material of low viscosity is employed, the spaces R can be evenly filled with the second adhesive by capillary action. FIG. 1C is a cross-sectional view showing the semiconductor wafer in the state where the epoxy material is cured after the adhesive charging step. In FIG. 1C, reference numeral 40 denotes the second adhesive. The second adhesive may comprise polyimide.

Figure 1D:
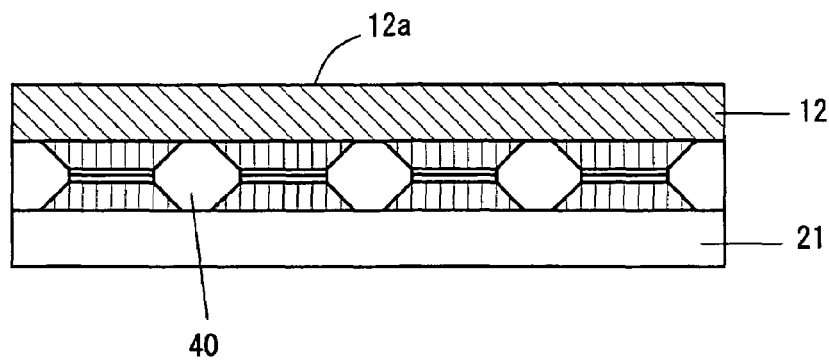
FIG. 1D is a cross-sectional view showing the semiconductor wafer after a laser lift-off step.

Thereafter, the sapphire substrate 11 is lifted off through laser beam radiation (laser lift-off step). Specifically, the semiconductor wafer shown in FIG. 1C, which has been formed through bonding, is irradiated with KrF high-power pulse laser beam of 248 nm with power density of 0.7 J/cm$^2$ or more from the sapphire substrate 11. Reciprocating scanning is performed in a horizontal direction. Through this laser beam radiation, for example, a portion of the high-concentration n$^+$-layer is melted at the interface with the aforementioned buffer layer to form a thin film, and decomposed into gallium (Ga) droplets and nitrogen (N$_2$). Thereafter, the sapphire substrate 11 is lifted off the semiconductor wafer, followed by washing of the thus-exposed surface of the n-type layer 12a with dilute hydrochloric acid. FIG. 1D is a cross-sectional view showing the semiconductor wafer after the washing process.

Figure 1E:
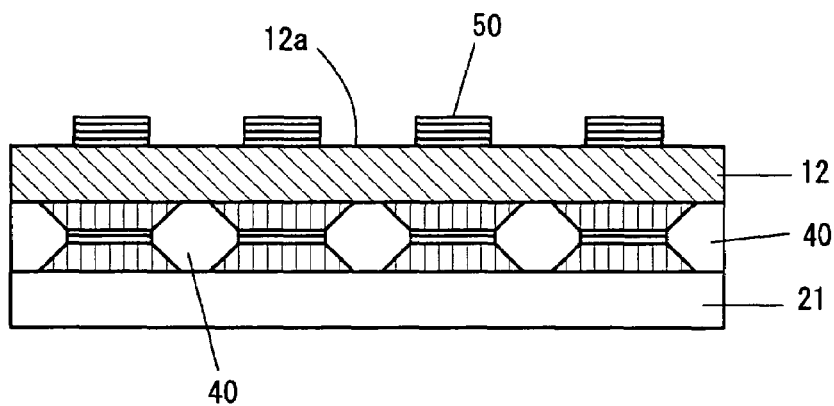
FIG. 1E is a cross-sectional view showing the semiconductor wafer after formation of n-electrodes 50.

Subsequently, n-electrodes 50 are formed on the thus-exposed surface of the n-type layer 12a through vapor deposition employing a resist mask. Each of the n-electrodes 50 may have, for example, a five-layer structure including the following layers: a vanadium (V) layer having a thickness of 15 nm, an aluminum (Al) layer having a thickness of 150 nm, a titanium (Ti) layer having a thickness of 30 nm, a nickel (Ni) layer having a thickness of 500 nm, and a gold (Au) layer having a thickness of 500 nm, the layers being successively provided on the n-type layer 12a through vapor deposition (FIG. 1E).

Figure 1F:
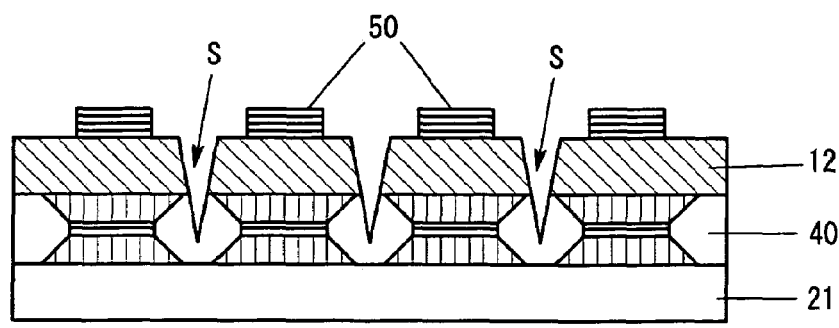
FIG. 1F is a cross-sectional view showing the semiconductor wafer after formation of separation trenches S.

Thereafter, as shown in FIG. 1F, separation trenches S are formed through half-cut dicing from the exposed surface of the n-type layer 12a toward the second adhesive 40. The separation trenches S do not necessarily reach the silicon substrate 210.

Subsequently, the semiconductor wafer of FIG. 1F is broken along the separation trenches S, to thereby yield light-emitting devices 100, each having the structure shown in FIG. 3.

In each of the light-emitting devices 100, the sapphire substrate 11 and the aforementioned buffer layer are removed, and the silicon substrate 210 exhibits electrical conductivity. Therefore, in the light-emitting device 100, which has the aforementioned configuration, electricity can be conducted from the back surface of the supporting substrate 20 (i.e., from the gold layer 21d shown in FIG. 2B).

Figure 4A:
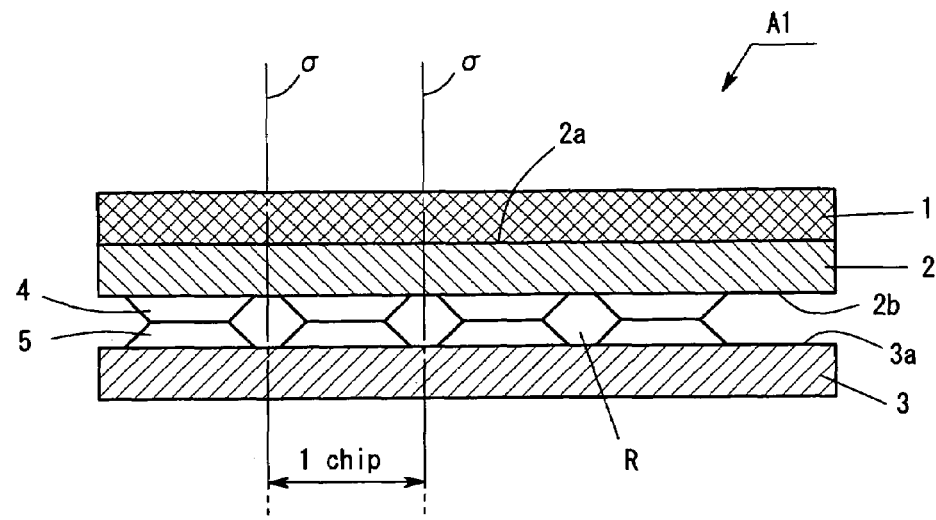
FIG. 4A is a cross-sectional view showing a semiconductor wafer A1 in which a metal layer is not provided merely in spaces R.
Figure 4B:
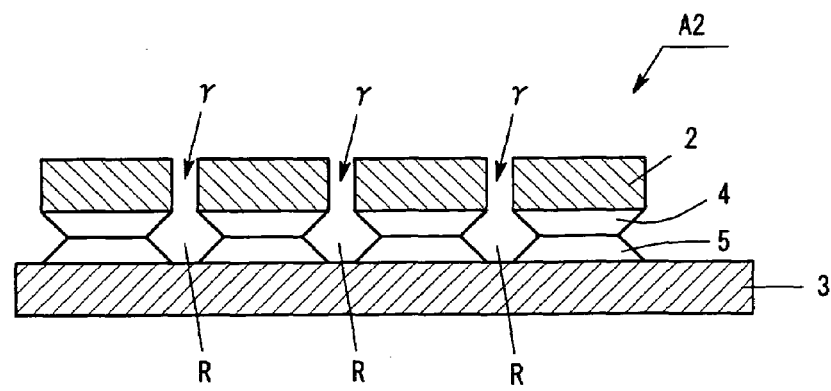
FIG. 4B is a cross-sectional view showing a semiconductor wafer A2 in which cracks γ occur along spaces R.

In the separation trench formation step for producing the light-emitting device 100, since the electrodes (metal layers) are not cut with a dicer, clogging of a dicer is obviated, and damage to the device (e.g., electrode exfoliation) does not occur. Addition of the second adhesive 40 prevents occurrence of cracks γ as shown in FIG. 4B. Therefore, separation trenches S of predetermined shape and size can be formed at predetermined positions, and thus the yield of the light-emitting device 100 can be improved.

The metal layers are interrupted at positions at which the second adhesive 40 is provided (i.e., positions between to-be-formed chips), and therefore the semiconductor wafer can be easily and reliably separated into individual chips.

As shown in FIG. 3, the two electrodes of the light-emitting device 100 are respectively provided on the top and bottom surfaces. Therefore, even when processing accuracy is somewhat low, short circuit between the electrodes can be prevented during the course of electrical connection (e.g., wire bonding).

[Other Modifications]

The present invention is not limited to the above-described embodiment, and the below-exemplified modifications may be made. Effects of the present invention can also be obtained through such modifications or applications according to the operation of the present invention.

(First Modification)

In the supporting substrate bonding step of the above-described first embodiment, in which the electrodes 13 are bonded, by use of the electrically conductive first adhesive 30, to the electrically conductive supporting substrate 20 for supporting the semiconductor crystal layer 12, the first adhesive 30 is applied to the flat-topped mounds 22. However, the first adhesive 30 may be provided in advance, through vapor deposition or a similar technique, in the form of a metal layer constituting the uppermost layer of at least one of the flat-topped protrusion 22 and the electrode 13. With such a modification, the first adhesive 30 can be more accurately provided on intended portions.

(Second Modification)

In the laser lift-off step of the above-described first embodiment, KrF high-power pulse laser beam of 248 nm is employed. However, the laser beam to be employed may be, for example, YAG laser beam (355 nm, 266 nm), XeCl laser beam (308 nm), or ArF laser beam (155 nm). The laser beam employed in the laser lift-off step may be any laser beam having a wavelength of shorter than 365 nm. Laser power is preferably regulated in consideration of the thickness of the crystal growth substrate.

The present invention is not limited to production of semiconductor light-emitting devices or semiconductor light-receiving devices, and is also applicable to production of other, semiconductor devices.

What is claimed is:

1. A method for producing a semiconductor device the method comprising:

growing a group III nitride based compound semiconductor crystal on a substrate;

an electrode formation step of forming metal layer electrodes in an islands-pattern on a surface of a semiconductor crystal grown on a crystal growth substrate, the surface being opposite a surface facing the crystal growth substrate, so that each electrode is provided in an area corresponding to a semiconductor device chip;

a supporting substrate bonding step of bonding the electrodes to an electrically conductive substrate for supporting the semiconductor crystal by use of a conductive first adhesive;

an adhesive charging step of charging a second adhesive comprising a resin into spaces formed between the semiconductor crystal and the supporting substrate through the supporting substrate bonding step at chip separation planes at which the supporting substrate is to be divided into individual chips, after the supporting substrate bonding step, the spaces being immersed in the second adhesive in the form of liquid in a direction perpendicular or non-parallel to the liquid surface;

a laser lift-off step of removing the crystal growth substrate from the semiconductor crystal through laser beam radiation;

a separation trench formation step of forming separation trenches along the spaces on the surface of the semiconductor crystal which has been exposed through the laser lift-off step; and a separation step of separating the resultant semiconductor wafer into individual chips along the separation trenches.

2. A method for producing a semiconductor device according to claim 1, wherein islands-patterned flat-topped mounds formed of an electrically conductive material are provided at a portion of the supporting substrate that is bonded to the electrodes formed in an islands-pattern so that the mounds are provided with respect to the corresponding electrodes.

3. A method for producing a semiconductor device according to claim 1, wherein the second adhesive comprises a base material, and filler particles having a thermal conductivity higher than that of the base material.

4. A method for producing a semiconductor device according to claim 2, wherein the second adhesive comprises a base material, and filler particles having a thermal conductivity higher than that of the base material.

5. A method for producing a semiconductor device according to claim 1, wherein, in the adhesive charging step, a portion of the supporting substrate is immersed in the second adhesive in the form of liquid in a direction perpendicular or non-parallel to the liquid surface.

6. A method for producing a semiconductor device according to claim 2, wherein, in the adhesive charging step, a portion of the supporting substrate is immersed in the second adhesive in the form of liquid in a direction perpendicular or non-parallel to the liquid surface.

7. A method for producing a semiconductor device according to claim 3, wherein, in the adhesive charging step, a portion of the supporting substrate is immersed in the second adhesive in the form of liquid in a direction perpendicular or non-parallel to the liquid surface.

* * * * *